United States Patent
Saitou

(10) Patent No.: US 6,169,022 B1
(45) Date of Patent: Jan. 2, 2001

(54) METHOD OF FORMING PROJECTION ELECTRODES

(75) Inventor: Nobukatsu Saitou, Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/168,881

(22) Filed: Oct. 9, 1998

Related U.S. Application Data

(63) Continuation-in-part of application No. 09/057,452, filed on Apr. 9, 1998, now abandoned.

(30) Foreign Application Priority Data

Oct. 13, 1997 (JP) .................................................. 9-279072
Sep. 25, 1998 (JP) ................................................ 10-272256

(51) Int. Cl.[7] .................................................. H01L 21/44
(52) U.S. Cl. .......................................... 438/613; 438/666
(58) Field of Search ..................................... 438/613, 666

(56) References Cited

U.S. PATENT DOCUMENTS

| | | | |
|---|---|---|---|
| 5,776,824 | * | 7/1998 | Farnworth et al. . |
| 5,786,239 | * | 7/1998 | Ohsawa et al. . |
| 5,885,891 | * | 3/1999 | Miyata et al. . |
| 5,960,308 | * | 9/1999 | Akagawa et al. . |
| 5,985,694 | * | 11/1999 | Cho . |
| 6,030,890 | * | 2/2000 | Iwabuchi . |

FOREIGN PATENT DOCUMENTS 7-122559     5/1995   (JP) .

* cited by examiner

Primary Examiner—John F. Niebling
Assistant Examiner—Josetta Jones
(74) Attorney, Agent, or Firm—Armstrong, Westerman, Hattori, McLeland, & Naughton

(57) ABSTRACT

A method of forming projection electrodes includes the steps of mounting a resin mask on a base having pad portions on which projection electrodes should be formed, the resin mask having openings used to position the projection electrodes, providing paste on the pad portions of the base via the resin mask, mounting the projection electrodes, positioned by the resin mask, on the pad portions of the base, and carrying out a heat processing step for heating the pad portions and the projection electrodes positioned by the resin mask so that the projection electrodes are joined to the pad portions.

15 Claims, 14 Drawing Sheets

METHOD OF FORMING PROJECTION ELECTRODES

This application is a Continuation-In-Part Application of U.S. patent application Ser. No. 09/057,452 entitled "METHOD OF FORMING PROJECTION ELECTRODES" filed on Apr. 9, 1998 abandoned.

BACKGROUND OF THE INVENTION

1. Field of the Invention

The present invention generally relates to a method of forming projection electrodes, and more particularly to a method of forming projection electrodes which includes a step of placing resin near positions at which the projection electrodes should be formed.

In general, as the method of forming the projection electrodes on a semiconductor device or a circuit board, a method using plating, a method using soldering paste and a method using solder balls have been known. For example, to form projection electrodes each of which has a thickness of several hundreds micrometers ($\mu$m), the method using the solder balls is used.

In recent years, circuit elements have been miniaturized, so that the projection electrodes are miniaturized and a space between the projection electrodes becomes narrow. In addition, for cost reduction, it is necessary to simplify the method for forming the projection electrodes. Thus, a method of easily forming miniaturized projection electrodes with a high reliability is desired.

2. Description of the Related Art

A description will be given, with reference to FIGS. 1 through 6, of a conventional method of forming projection electrodes using solder balls.

FIG. 1 shows a semiconductor device which is in an initial state before forming projection electrodes. The semiconductor device in this state has a so-called LGA (Land Grid Array) structure in which only a plurality of pad portions 10 are arranged in a mounting surface of a package 2.

Referring to FIG. 1, the package 2 has a multi-layer structure made of ceramic or resin. A cavity 12 is formed in the package 2. In the cavity 12, a semiconductor chip 4 is mounted and a part of an internal wiring pattern 6 is formed so as to be exposed.

The internal wiring pattern 6 is electrically connected to the pad portions 10 via an internal wiring portion (not shown) which is formed inside the package 2. The semiconductor chip 4 is connected to the internal wiring pattern by wires 8. Thus, the semiconductor chip 4 is electrically connected to the pad portions 10 via the wires 8, the internal wiring pattern 6 and the internal wiring portion.

To form projection electrodes 22 on the semiconductor device having the above structure, firsts as shown in FIG. 2, a metal mask 14 is set on the surface of the package 2 on which the pad portions 10 are formed (a mask setting step). The metal mask 14 has positioning openings 16 arranged at intervals equal to those at which the part portions 10 are arranged. The metal mask 14 is set so that the positioning openings 16 corresponds to the pad portions 10.

After the metal mask 14 is set on the package 2 as described above, paste 18 (flux) is provided in each of the positioning openings 16 of the metal mask 14 (a paste setting step) as shown in FIG. 3. As a method of providing the paste 18 in each of the positioning openings 16, for example, a screen printing method can be used. Due to providing the paste 18 in each of the positioning openings 16 of the metal mask 14, each of the pad portions 10 is covered with the paste 18.

Next, as shown in FIG. 4, solder balls 20 are set on the pad portions 10 (a projection electrode setting step). In this case, since solder balls 20 are positioned by the positioning openings 16 of the metal mask 14, the solder balls 20 can be accurately set on the pad portions 10. In addition, the paste 18 has a predetermined viscosity, so that the paste 18 functions as an adhesive. Thus, the solder balls 20 are in a temporary fixing state on the pad portions 10.

After the solder balls 20 are set on the pad portions 10 as described above, the metal mask 14 is removed from the package 2 as shown in FIG. 5. The package 2 is caused to pass through a reflow furnace so that a heating process is carried out. As a result, the solder balls 20 are melted so as to be joined to the pad portions 10. Projection electrodes 22 are thus formed on the pad portions 10 as shown in FIG. 6. That is, conventionally, the semiconductor device 24 having the projection electrodes 22 as shown in FIG. 6 is manufactured in accordance with the steps as described above.

In addition, FIGS. 23 through 26 show a method of forming projection electrodes on a BGA (Ball Grid Array) type semiconductor device. FIGS. 23 and 24 show semiconductor devices in a state in which the projection electrodes have not yet been formed. The semiconductor device in such a state has the so-called LGA structure. Only a plurality of pad portions 10 are formed on mounting surfaces of bases 26A and 26B. In FIG. 23, the base 26A is covered with an insulation film 27 in a state where the pad portions 10 are exposed.

In FIG. 23, the base 26A on which the pad portions 10 are formed has a structure using a so-called printed circuit board. In FIG. 24, the base 26B has a structure using a tape in which copper is applied on a single surface. An opposite surface of each of the mounting surfaces of the bases 26A and 26B are provided with a resin package 3, the semiconductor chip 4, the wires 8 and bonding pads 29.

The semiconductor chip 4 is connected to the base 26A (26B) by a die pad 5 and connected to the bonding pads 29 by the wires 8. The bonding pads 29 are connected to the pad portions 10 by using through holes 28 in a case shown in FIG. 23 and directly connected to the pad portions 10 in a case shown in FIG. 24. To protect the semiconductor 4, the wires 8 and the bonding pads 29, they are encapsulated in the resin package 3.

FIG. 25 shows a state in which solder balls 20 used for projection electrodes are provided on the semiconductor device shown in FIG. 23. In this state, the solder balls 20 are temporarily fixed on the pad portions 10 by solder paste (or flux) (a projection electrode providing step).

After the solder balls 20 are temporarily fixed on the pad portions 10, a heating process is carried out. FIG. 26 shows the semiconductor device in which the heating process is completed. Due to the heating process, the solder paste 18 is vaporized and the solder balls 20 are melted, so that the projection electrodes are formed.

In the conventional method of forming the projection electrodes, after the metal mask 14 is removed from the package 2 as shown in FIG. 5, or after the solder balls 20 are set on the pad portions 10 by using the solder paste 18, the solder balls 20 are supported by only the solder paste 18. In this state, the solder balls 20 are not sufficiently maintained on the pad portions 10.

In addition, in a state where the heating process is completed as shown in FIGS. 6 and 26, the projection electrodes 22 are maintained by only connecting forces between the projection electrodes 22 and the pad portions 10. Thus, the projection electrodes are not sufficiently maintained on the pad portions 10.

In the step of forming the projection electrodes 22 and while the semiconductor device 24 is being transported, the solder balls 20 or the projection electrodes 22 may be removed. Thus, a sufficient reliability of the fixation of the projection electrodes 22 is not obtained.

SUMMARY OF THE INVENTION

Accordingly, a general object of the present invention is to provide a novel and useful method of forming projection electrodes in which the disadvantages of the aforementioned prior art are eliminated.

A specific object of the present invention is to provide a method of forming projection electrodes with a high reliability.

The above objects of the present invention are achieved by a method of forming projection electrodes, comprising the steps of: (a) mounting a resin mask on a base having pad portions on which projection electrodes should be formed, the resin mask having openings used to position the projection electrodes; (b) providing paste on the pad portions of the base via the resin mask; (c) mounting the projection electrodes, positioned by the resin mask, on the pad portions of the base; and (d) carrying out a heat processing step for heating the pad portions and the projection electrodes positioned by the resin mask so that the projection electrodes are joined to the pad portions.

According to the present invention, since the resin mask is maintained to be on the base after the projection electrodes are mounted on the pad portions of the base, the projection electrodes are supported by the resin mask. After the resin mask is set on the base, the resin mask prevents the projection electrodes from being broken away from the base. Thus, a reliability of the semiconductor device having the base on which the projection electrodes are formed in accordance with the method of the present invention can be improved.

In addition, the resin mask functions as a so-called under-fill resin layer when the projection electrodes are fixed on a circuit board. Thus, stress based on the difference between the thermal expansion of the base and that of the circuit board is prevented from being concentrated upon the projection electrodes. As a result, the projection electrodes are prevented from being broken and separated from the pad portions.

It is preferable that the resin mask be made of thermoplastic resin. In this case, when a semiconductor device having the base on which the projection electrodes are formed in accordance with the method of the present invention is heated, for example, to mount the semiconductor device on a circuit board, the space between the semiconductor device and the circuit board can be closely filled with the resin (caused by the resin mask).

The above objects of the present invention are also achieved by a method of forming projection electrodes, comprising the steps of: (a) mounting a metal mask on a base having pad portions on which projection electrodes should be formed, the metal mask having openings used to position the projection electrodes; (b) providing paste on the pad portions of the base via the metal mask; (c) mounting the projection electrodes, positioned by the metal mask, on the pad portions of the base; (d) carrying out, after the metal mask is removed from the base, a heat processing step for heating the pad portions and the projection electrodes so that the projection electrodes are joined to the pad portions; and (e) forming a resin layer on a surface of the base on which the projection electrodes are formed, a thickness of the resin layer being less than a height of each of the projection electrodes.

According to the present invention as described above, since the projection electrodes are supported by the resin layer the reliability of the semiconductor device can be improved. In addition, when the semiconductor is mounted on a circuit board, the resin layer functions as a so-called under-fill resin. As a result, stress based on the difference between the thermal expansion of the semiconductor device and that of the circuit board is prevented from being concentrated upon the projection electrodes. Thus, the projection electrodes are prevented from being broken and separated from the pad portions.

The above objects of the present invention are also achieved by a method of forming projection electrodes, comprising the steps of: (a) mounting projection electrodes on pad portions formed on a base on which a resin mask having openings is provided so that the pad portions are exposed through the openings of the resin mask; and (b) carrying out a heat processing step for heating the base, the resin mask and the projection electrodes so that the projection electrodes are joined to pad portions.

According to the present invention as claimed above, when the projection electrodes are mounted on the base, the resin mask positions the projection electrodes on the pad portions. In the heat processing step, the projection electrodes are joined to the pad portions. The projection electrodes joined to the pad portions can be protected by a resin layer (the resin mask) from stress based on the using environment of the semiconductor (mechanical stress or thermal stress).

BRIEF DESCRIPTION OF THE DRAWINGS

Other objects, features and advantages of the present invention will be apparent from the following description when read in conjunction with the accompanying drawings, in which.

DESCRIPTION OF THE PREFERRED EMBODIMENTS

A description will be given, with reference to FIGS. 7 through 12, of a first embodiment of the present.

Figure 7:
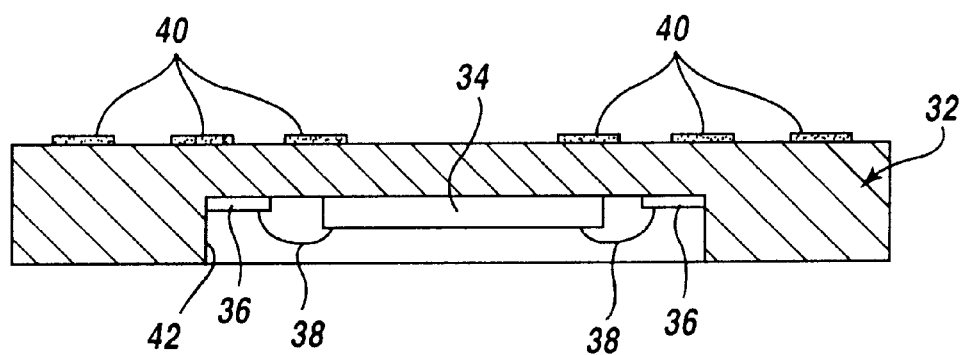
FIG. 7 is a diagram illustrating an initial state in a method of forming projection electrodes according to a first embodiment of the present invention.

FIG. 7 shows a semiconductor device which is in an initial state before projection electrodes are formed. The semiconductor device in this state has the so-called LGA structure in which only a plurality of pad portions 40 are arranged on a mounting surface of a package 32 (a base).

Referring to FIG. 7, the package 32 has a multilayer structure made of ceramic or resin. A cavity 42 is formed in the package 32. In the cavity 42, a semiconductor chip 34 is mounted and a part of an internal wiring pattern 36 is formed so as to be exposed.

The internal wiring pattern 36 is electrically connected to the pad portions 40 via an internal wiring portion (not shown) which is formed inside the package 32. The semiconductor chip 34 is connected to the internal wiring pattern 36 by wires 38. Thus, the semiconductor chip 34 is electrically connected to the pad portions 40 via the wires 38, the internal wiring pattern 36 and the internal wiring portion.

Figure 1:
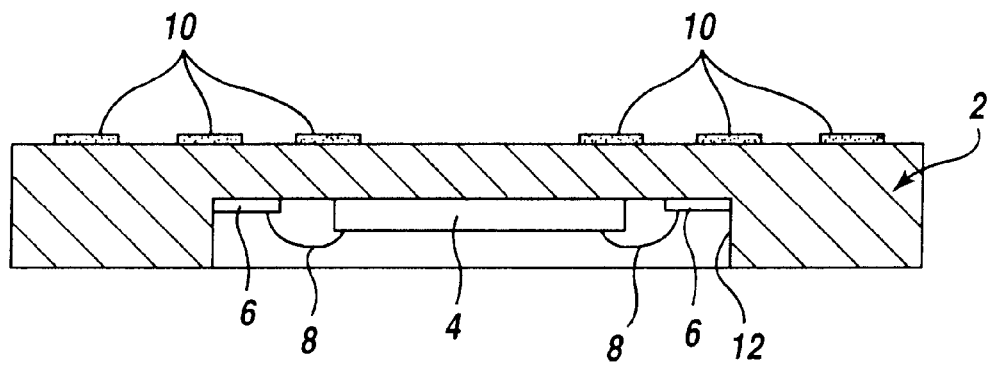
FIG. 1 is a diagram illustrating an initial state in a conventional method of forming projection electrodes.
Figure 2:
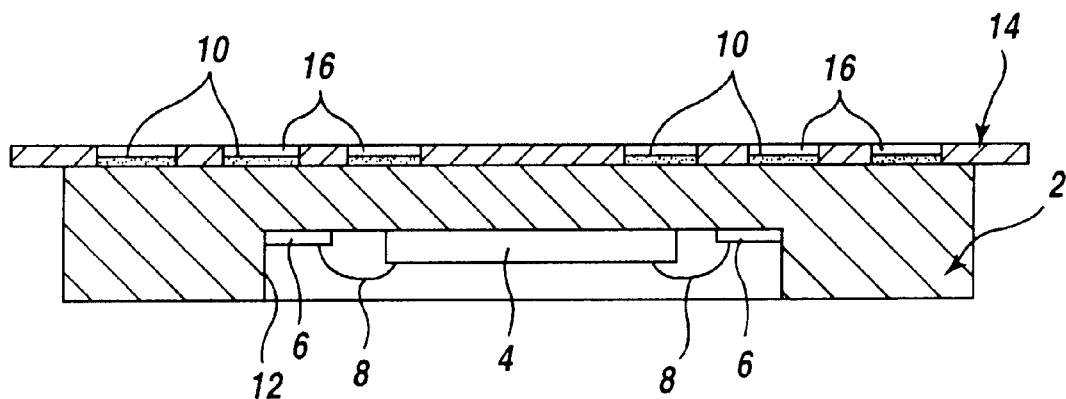
FIG. 2 is a diagram illustrating a mask setting step in the conventional method of forming the projection electrodes.
Figure 3:
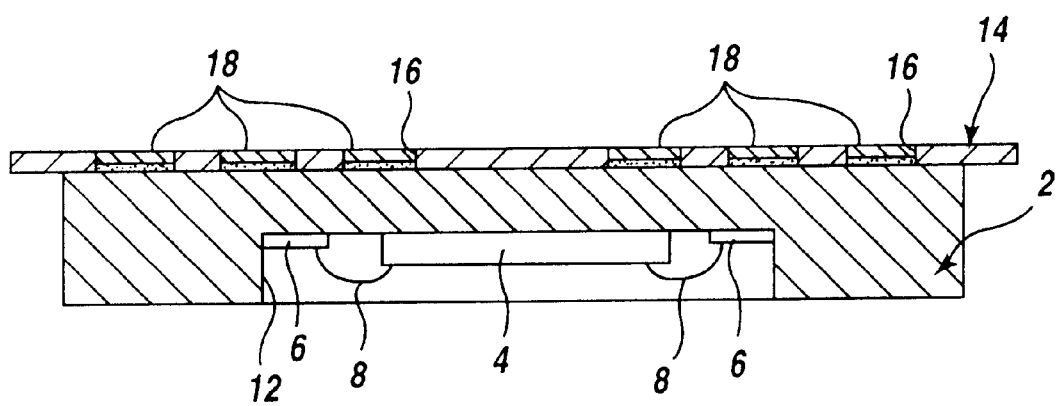
FIG. 3 is a diagram illustrating a paste setting step in the conventional method.

The semiconductor device in this state has the same structure as the semiconductor device in the conventional case as shown in FIG. 1.

Figure 8:
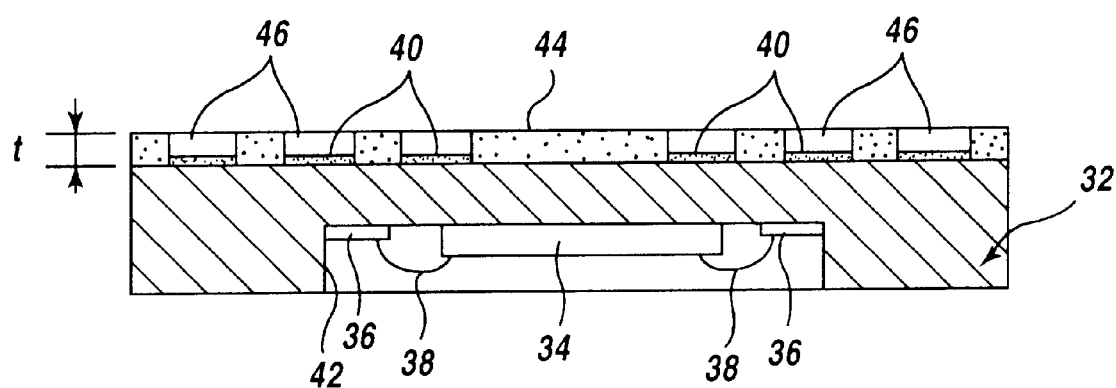
FIG. 8 is a diagram illustrating a mask setting step in the method according to the first embodiment of the present invention.
Figure 9:
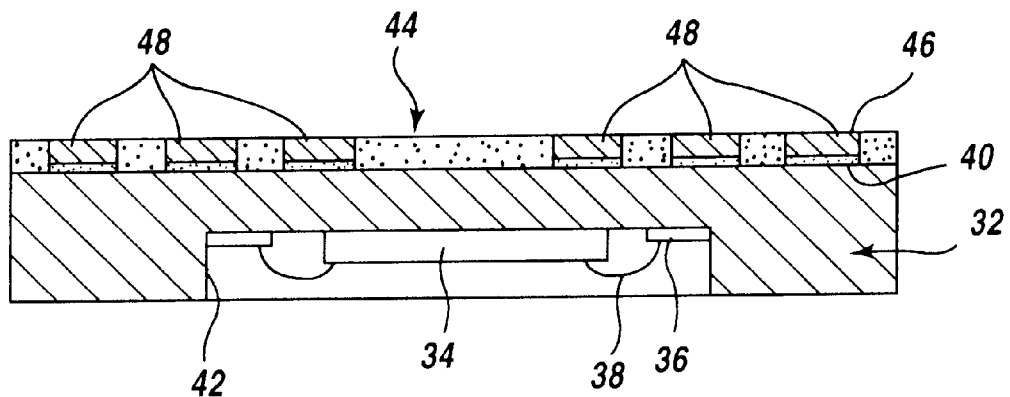
FIG. 9 is a diagram illustrating a paste setting step in the method according to the first embodiment of the present invention.

To form projection electrodes 52 on the semiconductor device having the structure as described above, first, a resin mask 44 is set on the surface of the package 32 on which the pad portions 40 are formed as shown in FIG. 8 (the mask setting step).

The resin mask 44 is made of thermoplastic resin (e.g., polyimide resin). The resin mask 44 has positioning openings 46 arranged at intervals equal to those at which the pad portions 40 are arranged. The resin mask 44 is set on the surface of the package 32 so that the positioning openings 46 face the pad portions 40. In the state where the resin mask 44 is set on the surface of the package 32, parts of the surface other than parts on which the pad portions 40 are provided are covered with the resin mask 44.

The resin mask 44 is hardened at the normal temperature, so that the positions of the positioning openings 46 in the resin mask 44 are maintained with accuracy. The thickness (t) of the resin mask 44 is about half of the diameter (R) (t=R/2) of each of solder balls 50 which will be described later (see FIG. 10).

After the resin mask 44 is set on the package 32 as described above, paste 48 (e.g., flux) is provided in each of the positioning openings 46 of the resin mask 44 (a paste setting step). The paste 48 is used to temporarily fix solder balls 50 on the package 32 in a projection electrode setting step which will be described later and to improve the adhesion between the solder balls 50 and the pad portions 40 in a heat processing step.

The paste 48 can be provided in each of the positioning openings 46 using a dispenser or by the screen printing method. Due to providing the paste 48 in each of the positioning openings 46, the pad portions 40 are covered with the paste 48.

Figure 4:
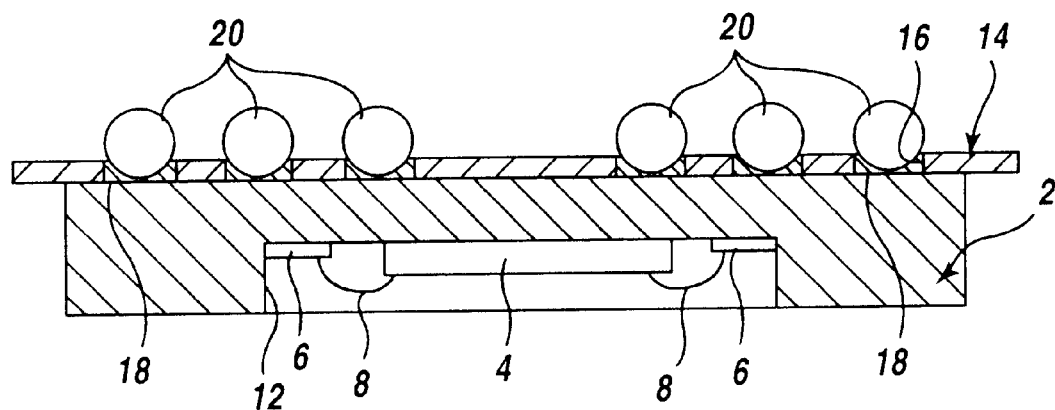
FIG. 4 is a diagram illustrating a projection electrode setting step in the conventional method.
Figure 5:
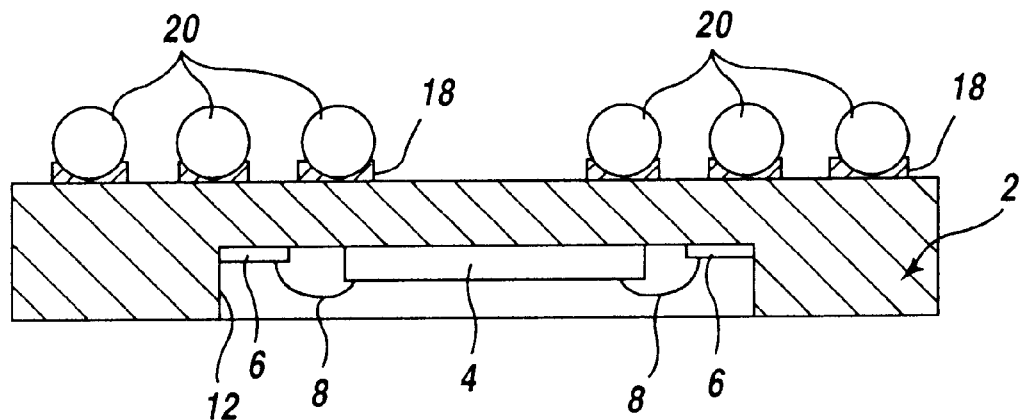
FIG. 5 is a diagram illustrating a state where a metal mask is removed from a package in the conventional method.
Figure 10:
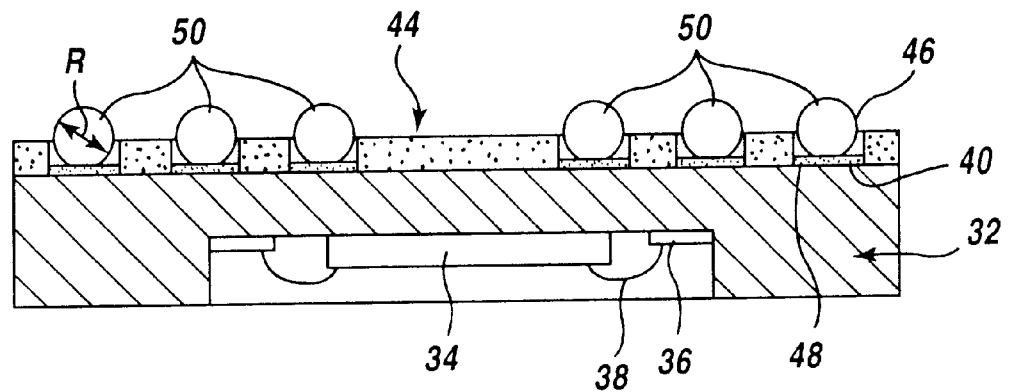
FIG. 10 is a diagram illustrating a projection electrode setting step in the method according to the first embodiment of the present invention.

Next, as shown in FIG. 10, solder balls 50 are set on the pad portions 40 (a projection electrode setting step). In this step, the solder balls 50 are positioned by the positioning openings 46 of the resin mask 44. That is, the resin mask 44 functions in the same manner as the metal mask 14 (see FIG. 4) as described above.

The solder balls 50 are positioned by the positioning openings 46 of the resin mask 44, so that the solder balls 50 can be accurately set on the pad portions 40. In addition, since the paste 48 has a predetermined viscosity so as to function as an adhesive, the solder balls 50 are temporarily fixed on the pad portions 40 by the paste 48 in the state shown in FIG. 10. The solder balls 50 are further supported by the resin mask 44, so that a state where the solder balls 50 are accurately set on the package 32 is maintained.

After the solder balls 50 are set on the pad portions 40, a heat processing step is applied to the package 32 in a state where the resin mask 44 is set on the package 32. In this heat processing step, the package 32 provided with the resin mask 44 is caused to pass through a reflow furnace so that the heat processing is performed. Since the solder balls 50 are supported by the resin mask 44, the solder balls 50 are prevented from being broken away from the package 32.

Figure 11:
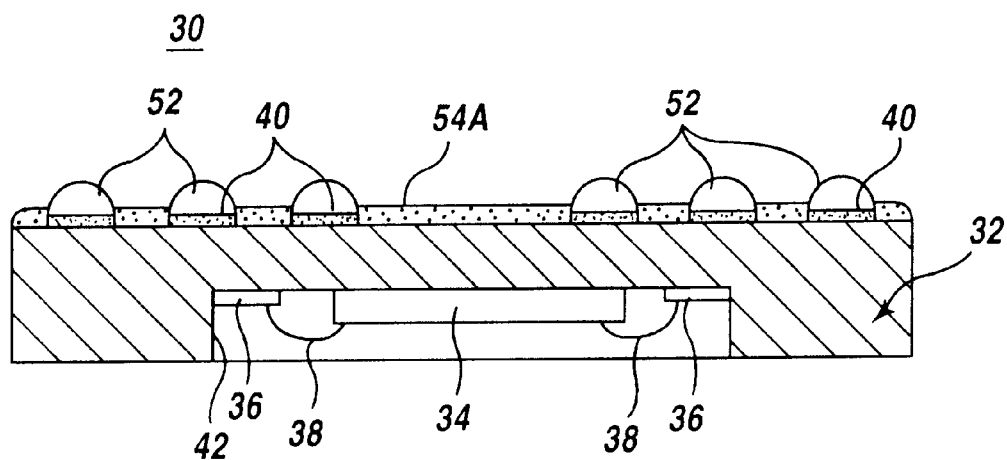
FIG. 11 is a diagram illustrating a heat processing step in the method according to the first embodiment of the present invention.

Due to executing the heat processing step, the solder balls 50 are melted so as to be joined to the pad portions 40. As a result, the projection electrodes 52 are formed as shown in FIG. 11. In addition, the resin mask 44 made of the thermoplastic resin is also melted, so that positioning openings 46 collapse and disappear. Hereinafter, a resin layer formed by melting the resin mask 44 is referred to as an under-fill resin layer 54A. According to a series of steps as described above, the semiconductor device 30 having the projection electrodes 52 and the under-fill resin layer 54A is formed as shown in FIG. 11.

In the present embodiment, a melting point Tm of the resin mask 44 is not less than a melting point Tb of the solder balls 50 (the projection electrodes 52) (Tm≧Tb). Thus, the resin mask 44 is prevented from being melted before the solder balls 50 are melted. As a result, the solder balls 50 can be firmly joined to the pad portions 40. In addition, since the melting point of the solder balls is relatively low, the resin mask 44 (the under-fill resin layer 54A) can be prevented from being broken by the heat of melted solder.

According to the first embodiment of the method of forming the projection electrodes, the resin mask 44 is not removed from the package 32 after the mask setting step is performed, so that the semiconductor device 30 can be maintained in a state where the projection electrodes 52 are fixed on the package 32. Thus, in the step for forming the projection electrodes 52 after the resin mask 44 is mounted on the package 32 and while the semiconductor device is being transported, the solder balls 50 and the projection electrodes 52 can be prevented from being removed from the package 32. Thus, the reliability of the semiconductor device 30 can be improved.

Figure 12:
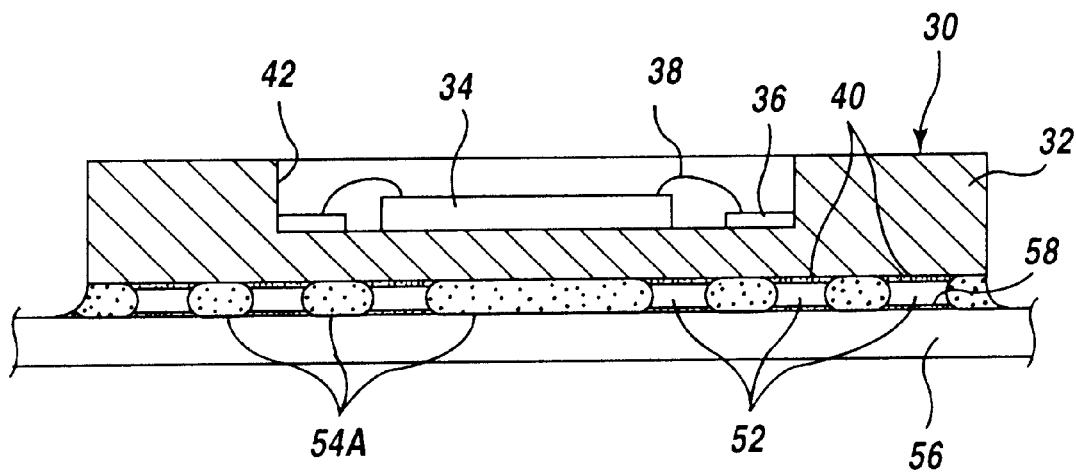
FIG. 12 is a diagram illustrating a state where a semiconductor device shown in FIG. 11 is mounted on a board.

In addition, as shown in FIG. 12, in a state where the semiconductor device 30 having the structure described above is mounted on a circuit board 56, the under-fill resin layer 54A (the resin mask 44) is set between the package 32 and the circuit board 56. The under-fill resin layer 54A prevents the stress based on the difference between the thermal expansion of the semiconductor device 30 and that of the circuit board 56 from being concentrated upon the projection electrodes 52. Thus, the projection electrodes 52 are prevented from being broken and separated from the pad portions 40 and connecting patterns 58 (formed on the circuit board 56).

A description will now be given, with reference to FIGS. 13 and 14, of a second embodiment of the present invention.

In the method according to the second embodiment of the present invention, in the same manner as in the conventional case shown in FIGS. 1 through 5, the solder balls are set using the metal mask 14. After the metal mask 14 is removed from the package, the heat processing step is carried out. A resin providing step and a heat processing step are then executed so that projection electrodes 22 are formed on the package.

Figure 13:
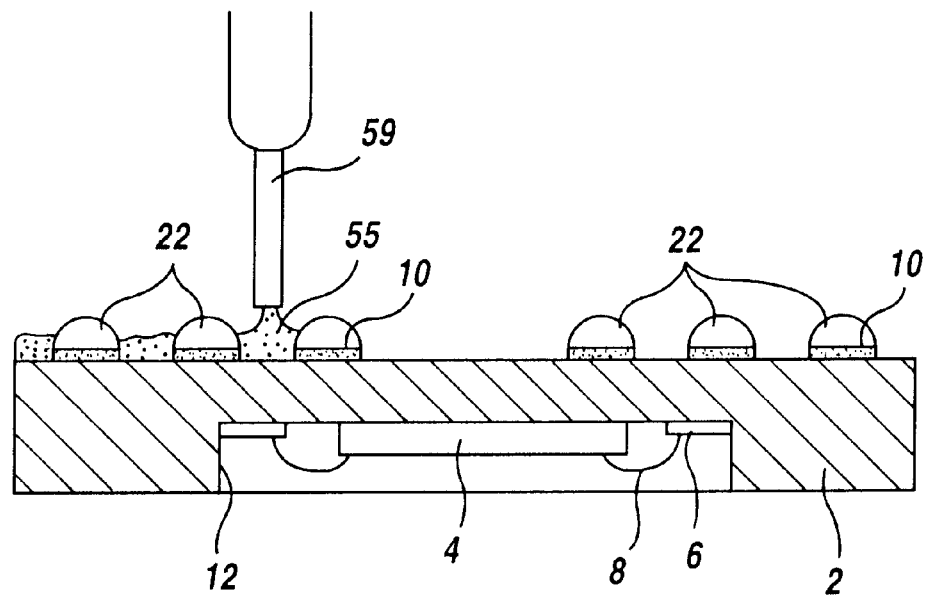
FIG. 13 is a diagram illustrating a resin providing step in the method according to a second embodiment of the present invention.
Figure 14:
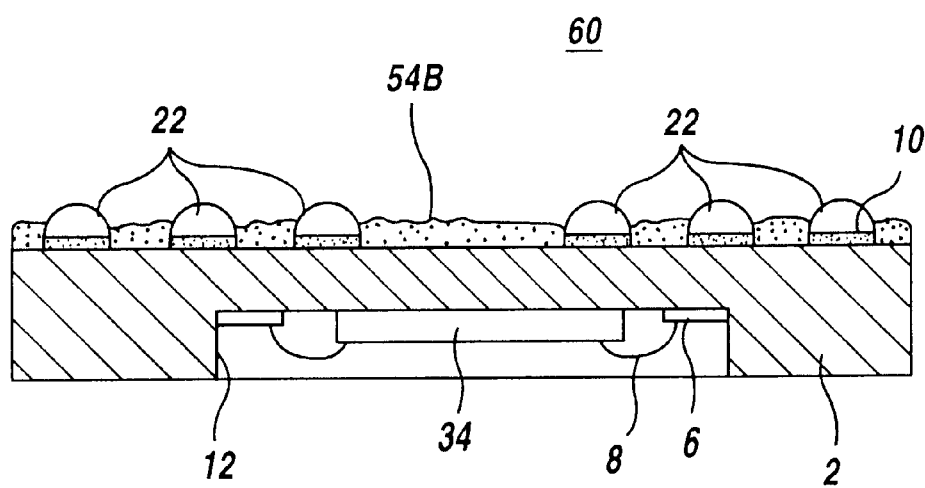
FIG. 14 is a diagram illustrating a semiconductor device manufactured in accordance with the method of the second embodiment of the present invention.

FIG. 13 illustrates the resin providing step. Referring to FIG. 13, a surface of the package 2 on which the projection electrodes 22 are formed (on which the pad portions 10 are formed) is provided with resin 55 having liquidity (hereinafter referred to as liquid resin 55).

In this embodiment, the liquid resin 55 is provided on the package 2 by using a nozzle 59. In this case, the liquid resin 55 is thermoplastic resin. A layer of the liquid resin 55 provided on the package 2 has a thickness which is about half the diameter of each of the solder balls 20.

After the liquid resin 55 is provided on the surface of the package 2 in the resin providing step as described above, the heat processing step is carried out. In the heat processing step, the package 2 provided with the liquid resin 55 is caused to pass through the reflow furnace so that the liquid resin 55 is melted. As a result, the space between the projection electrodes 22 is filled with the liquid resin 55. The liquid resin 55 is then hardened so that a under-fill resin layer 54B is formed. A semiconductor device 60 manufactured in accordance with the method of the second embodiment of the present invention is shown in FIG. 14.

According to the method of the second embodiment, the projection electrodes 22 can be formed in the same process using the same equipment as in the conventional case. In addition, after the metal mask 14 is removed from the package 2, the projection electrodes 22 are supported on the package 2 by the liquid resin 55 provided in the resin providing step and the under-fill resin layer 54B formed in the heat processing step. As a result, the reliability of the semiconductor device 60 can be improved.

In the same manner as in the first embodiment, the under-fill resin layer 54B prevents the stress based on the difference between the thermal expansion of the semiconductor device 60 and that of the circuit board from being concentrated upon the projection electrodes 22. Thus, the projection electrodes 22 and other portions are prevented from being broken.

Further, since the liquid resin 55 is used, it is not necessary for the resin mask 44 to accurately form the positioning openings 46.

Figure 16:
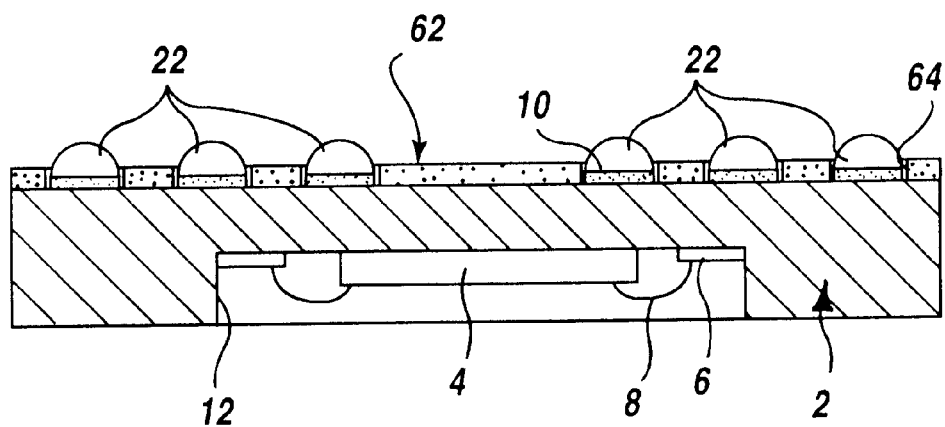
FIG. 16 is a diagram illustrating a resin plate providing step (the second) in the method according to the third embodiment of the present invention.
Figure 17:
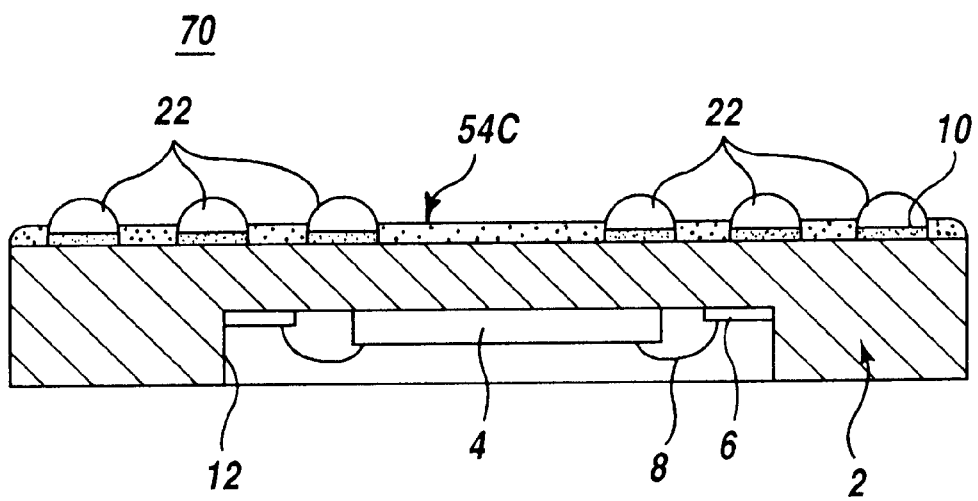
FIG. 17 is a diagram illustrating a semiconductor device manufactured in accordance with the method of the third embodiment of the present invention.

A description will now be given, with reference to FIGS. 15 through 17, of a third embodiment of the present invention.

In the method according to the third embodiment of the present invention, in the same manner as in the second embodiment, the solder balls 20 are set on the pad portions 10 formed on the package 2 using the metal mask 14. After the metal mask 14 is removed from the package 2, a step for providing a resin plate and a heat processing step are executed so that the projection electrodes 22 are formed on the package 2.

Figure 15:
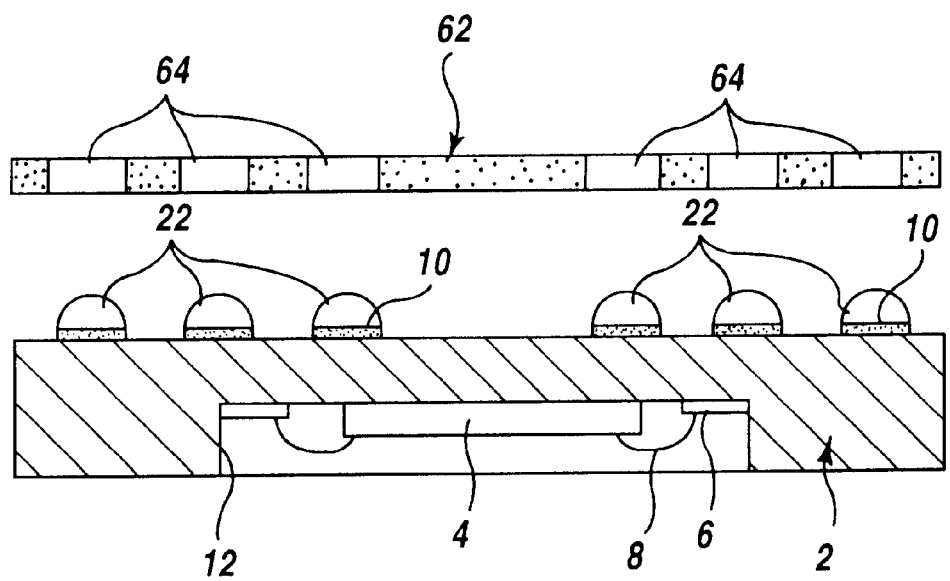
FIG. 15 is diagram illustrating a resin plate providing step (the first) in the method according to a third embodiment of the present invention.

FIG. 15 illustrates a resin plate providing process. In the resin providing process, a resin plate 62 in which openings 64 are formed so as to be arranged at the same intervals as the pad portions 10 formed on the package 2 is used. The resin plate 62 is provided on the surface of the package 2 on which the projection electrodes 22 are formed (the pad portions are formed) so that the projection electrodes 22 on the package 2 are set in the openings 64 of the resin plate 62 as shown in FIG. 16.

In this embodiment, since the resin plate 62 is used, the resin can be rapidly provided on the surface of the package 2 in comparison with in the second embodiment in which the liquid resin 55 is provided on the package 2 by using the nozzle 59. The resin plate 62 is made of thermoplastic resin. The thickness of the resin plate 62 is about half the diameter of each of the solder balls 20.

After the resin plate 62 is provided on the surface of the package 2, the heat processing step is carried out. In the heat processing step, the package 2 on which the resin plate 62 is provided is caused to pass through the reflow furnace so that the resin plate 62 is melted. As a result, the space between the projection electrodes 22 is filled with the resin. The resin Is then hardened so that an under-fill resin layer 54C is formed. A semiconductor device 70 manufactured in accordance with the method of the third embodiment of the present invention is shown in FIG. 17.

According to the third embodiment, the projection electrodes 22 can be formed in the same process using the same equipment as in the conventional case. Thus, the projection electrodes 22 can be formed on the package 2 with a low cost. In addition, after the resin plate providing step is carried out, the projection electrodes 22 are supported on the package 2 by the resin plate 62 provided or the under-fill resin 54C formed in the heat processing step. As a result, the reliability of the semiconductor device 70 can be improved.

In addition, the under-fill resin layer 54C prevents stress based on the difference between the thermal expansion of the semiconductor device 70 and that of the circuit board being concentrated upon the projection electrodes 22. Thus, the projection electrodes 22 are prevented from being broken, in the same manner as in the first and second embodiments.

A description will now be given of a fourth embodiment of the present invention.

FIGS. 18 through 22D illustrates the method of forming projection electrodes according to a fourth embodiment of the present invention. The method according to the fourth embodiment is applied to the BGA (Ball Grid Array) type semiconductor device.

In FIGS. 18 through 22D, those parts which are the same as those shown in FIGS. 23 through 26 are given the same reference numbers and the descriptions of those parts are omitted. In addition, in FIGS. 18 through 22D, those parts which are the same as those shown in FIGS. 7 through 17 are given the same reference numbers and the description of those parts are omitted.

Figure 18:
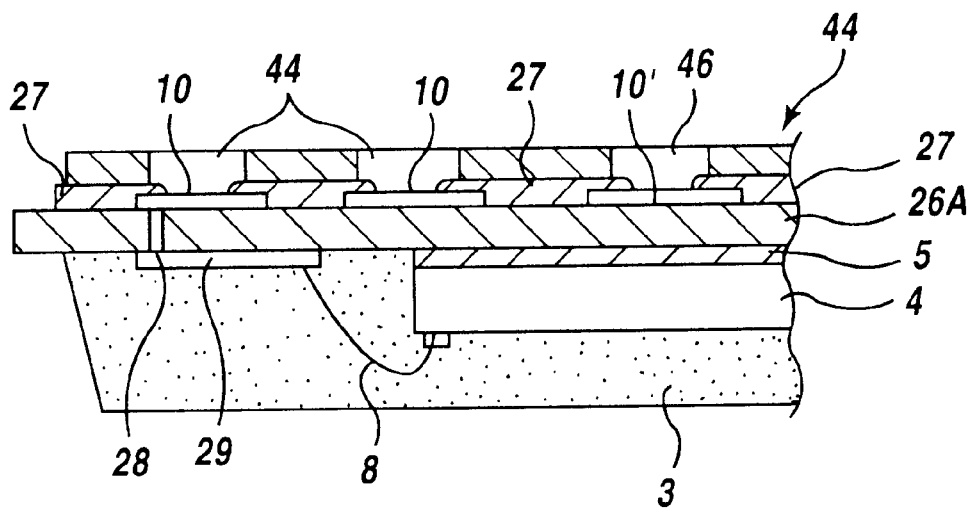
FIG. 18 is a diagram illustrating a state where a mask setting step is completed in the method according to a fourth embodiment of the present invention.

FIG. 18 shows a semiconductor device in an initial state where the projection electrodes 22 have not yet been provided. This state differs from the state shown in FIG. 23 described above in that a protection mask 44 (hereinafter, referred to as a resin mask 44) having positioning openings 46 is provided. The positioning openings 46 are arranged so as to face positions at which the projection electrodes 22 should be placed. The resin mask 44 is made of thermoplastic resin (e.g., polyimide resin). The resin mask 44 is in a hardened state at a normal temperature and has a softening point at which the resin mask 44 can be softened in a heat processing step. The thickness of the rein mask 44 corresponds to about half of the diameter of a solder ball 20 which will be described later.

The resin mask 44 having the above structure is provided in a resin mask setting step before a projection electrode setting step is carried out. Due to providing the resin mask 44 before the projection electrode providing setting step is carried out and covering areas other than the areas on which the pad portions 10 are formed with the resin mask 44, the pad portions 10 are exposed through the positioning openings 46. Thus, the pad portions 10 are protected by the resin mask 44. As a result, the pad portions 10 can be prevented from being damaged.

Figure 19:
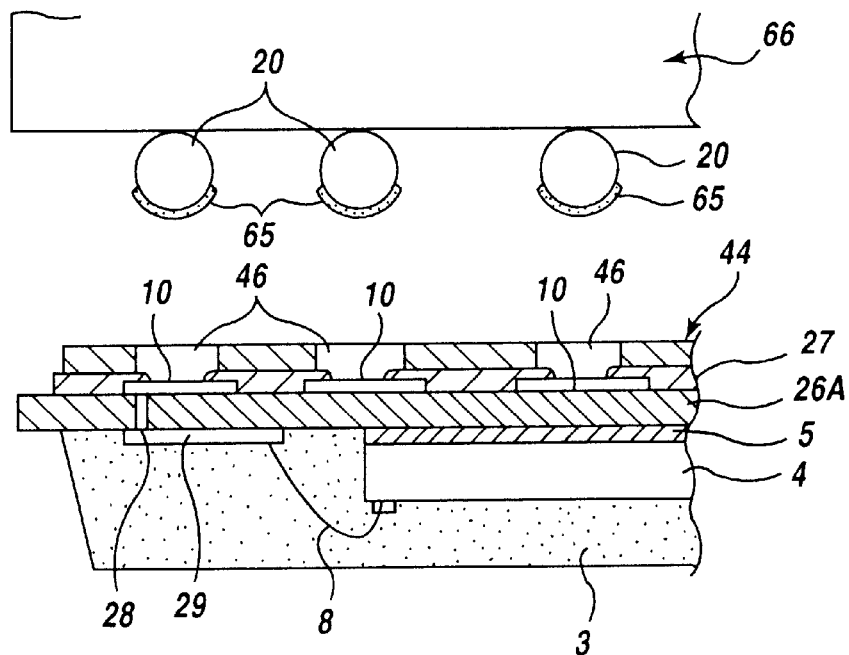
FIG. 19 is a diagram illustrating a projection electrode setting step in the method according to the fourth embodiment of the present invention.

In the present embodiment, the projection electrode providing step is carried out with respect to the semiconductor device which is in the initial state. FIG. 19 illustrates the projection electrode providing step. In the projection electrode providing step, the solder balls 20 are set on the pad portions 10 exposed through the positioning openings 46 of the resin mask 44.

The solder balls 20 are absorbed by a mounting device 66 as shown in FIG. 19 and carried to a space over the semiconductor device. In addition, as will be described later, in the state where the solder balls 20 are located over the semiconductor device, paste 65 is provided on a bottom portion of each of the solder balls 20.

After a positioning process for the solder balls 20 and the pad portions 10 is carried out, the mounting device 66 is moved downward. The solder balls 20 are thus put on the pad portions 10 exposed through the positioning openings 46. In this case, the positioning openings 46 of the resin mask 44 is used to position the solder balls 20, so that the solder balls 20 can be connected to the pad portions 10 with a high accuracy.

A detailed description will now be given, with reference to FIGS. 22A through 22D, of a process for carrying the solder balls 22 to the space over the semiconductor device (a solder ball carrying step).

Figure 22A:
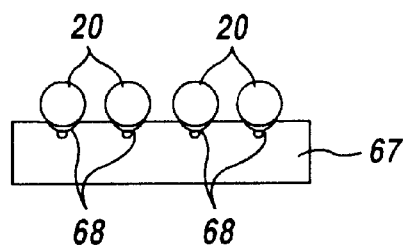
FIGS. 22A through 22D are diagrams illustrating details of the projection electrode setting step in the method according to the forth embodiment of the present invention;.

In the solder ball carrying step, first, as shown in FIG. 22A, the solder balls 20 are set on a jig 67 so as to be aligned. Concave portions 68 are formed at the same intervals as the pad portions 10 on the jig 67. The solder balls 20 are engaged in the concave portions 68, so that the solder balls 20 are aligned at the same intervals as the pad portions 10.

Figure 22B:
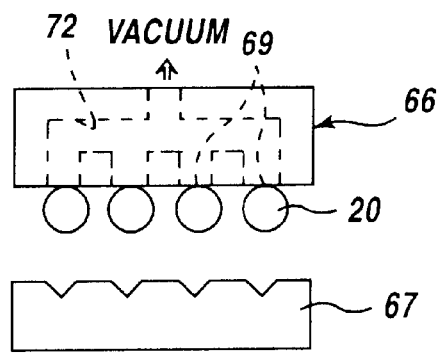

Next, as shown in FIG. 22B, the solder balls 20 are absorbed by the mounting device 66 in a state where the alignment of the solder balls 20 is maintained. The mount device 66 can be moved by a carriage mechanism which is not shown. Inside the mounting device 66, an internal absorbing pipe 72 is formed. The internal absorbing pipe 72 is branched into branch pipes which have absorbing openings 69 formed at ends thereof.

The absorbing openings 69 are arranged at the same intervals as the pad portions 10. Another end of the absorbing pipe 72 is connected to a vacuume pump (not shown). Due to an absorbing process in the mounting device 66, the alignment of the solder balls 20 is maintained and the solder balls 20 is held on (transferred to) the mounting device 66.

Figure 22C:
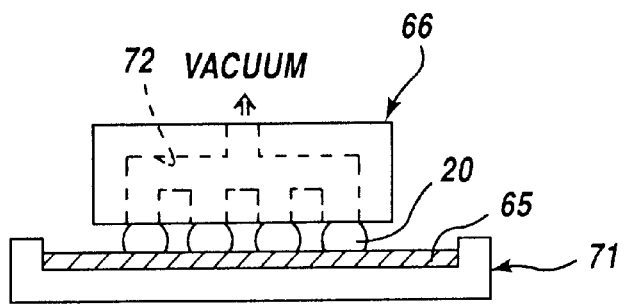
Figure 22D:
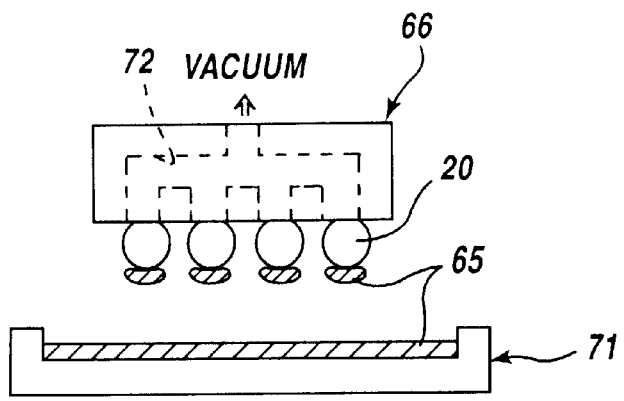
Figure 23:
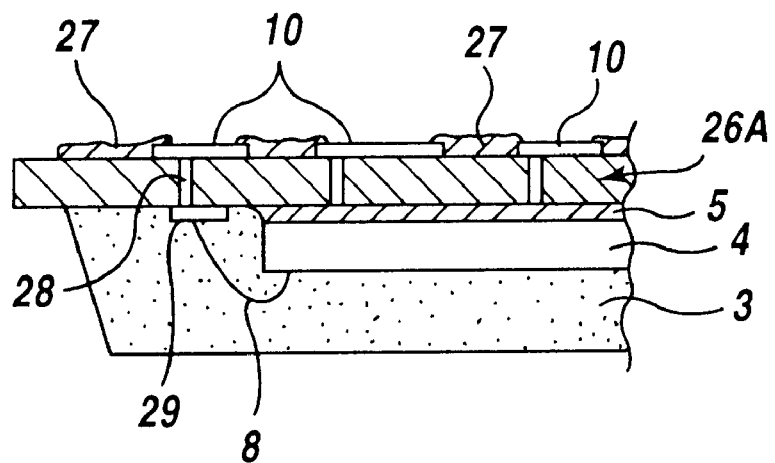
FIG. 23 is a diagram illustrating an initial state in a conventional method of forming projection electrodes.
Figure 24:
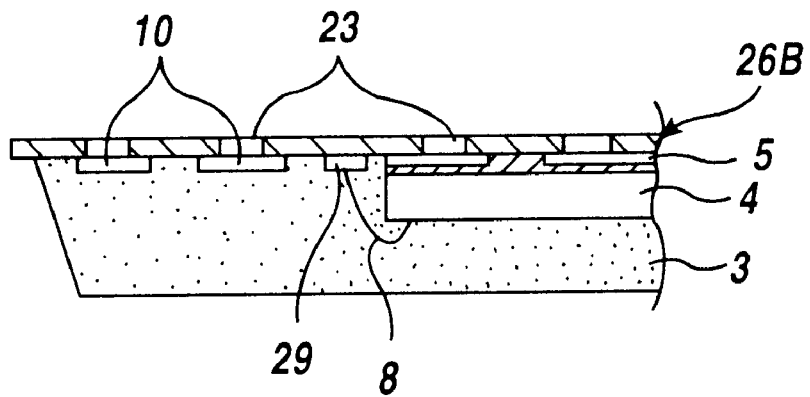
FIG. 24 is a diagram illustrating an initial state in another conventional method of forming projection electrodes.
Figure 25:
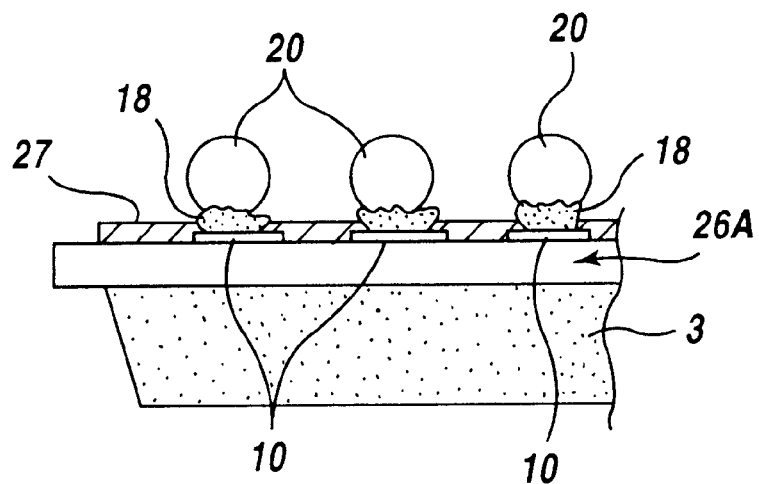
FIG. 25 is a diagram illustrating a state where solder bolls are set on the base in the conventional method of forming the projection electrodes.
Figure 26:
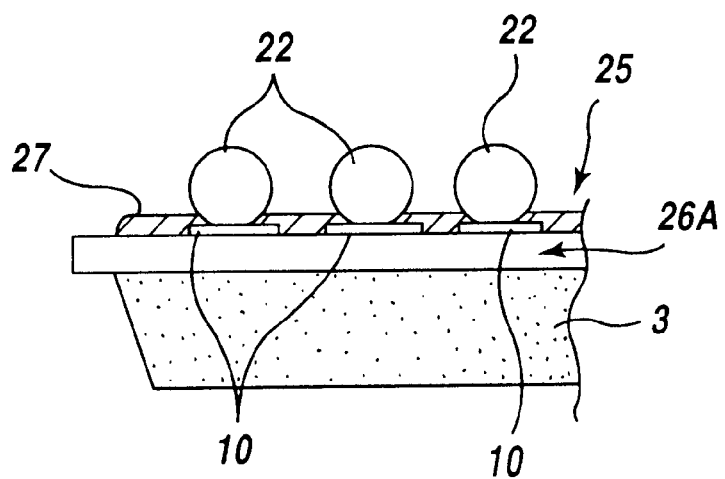
FIG. 26 is a diagram illustrating a state where the heat processing step is completed in the conventional method of forming the projection electrodes.

The mounting device 66 holding the solder balls 20 is moved to a space over a paste tray 71 with which the paste 65 is filled and moved downward, so that predetermined bottom areas of the solder balls 20 are soaked in the paste 65 as shown in FIG. 22C. The mounting device 66 is then moved upward. The paste 65 are provided on the predetermined bottom areas of the solder balls 20 as shown in FIG. 22D. After this, the mounting device 66 is moved to the space over the semiconductor device and in the state shown in FIG. 19.

In the present embodiment, in the step for carrying the solder balls 20 using the mounting device 66, the paste 65 is provided on the solder balls 20. However, the paste may be provided in the positioning openings 46 of the resin mask 44 by using the screen printing method in the same manner as in the first embodiment. After this, the solder balls 20 are set on the pad portions 10.

Figure 20:
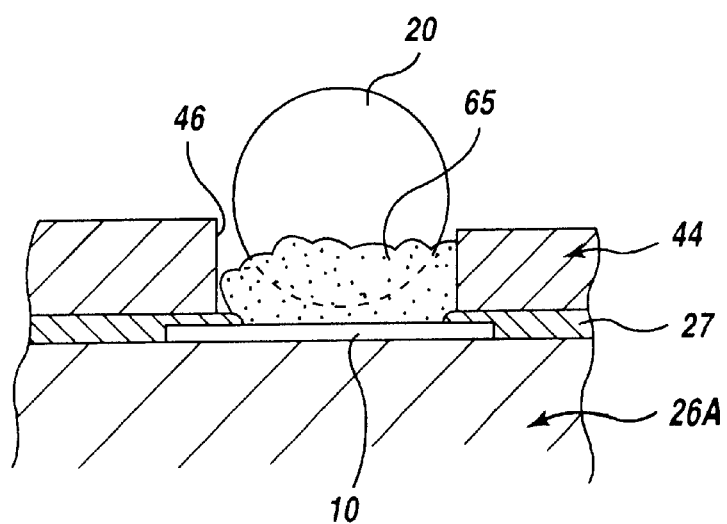
FIG. 20 is a diagram illustrating an enlarged portion including a solder ball in which the projection electrode setting step is completed in the method according to the fourth embodiment of the present invention.

FIG. 20 is an enlarged diagram showing a state where the solder ball is set on the semiconductor device being in the initial state. As shown in FIG. 20, the solder ball 20 is temporarily fixed in the positioning opening 46 of the resin mask 44 by the paste 65.

Thus, the solder ball 20 can be prevent from being removed from the pad portion 10 before the heat processing step is carried out. In addition, in the heat processing step, due to the paste (the flux) provided between the solder ball 20 and the pad portion 10, the pad portion 10 and the solder ball 20 can be smoothly and firmly joined to each other.

After the projection electrode providing step as described above is completed, the heat processing step is carried out. In the heat processing step, the semiconductor device in which the solder balls are set on the pad portions 10 passes through the reflow furnace so that the semiconductor is heated. The solder balls 20 are thus melted and joined to the pad portions 10, so that the projection electrodes 22 are formed.

Figure 21:
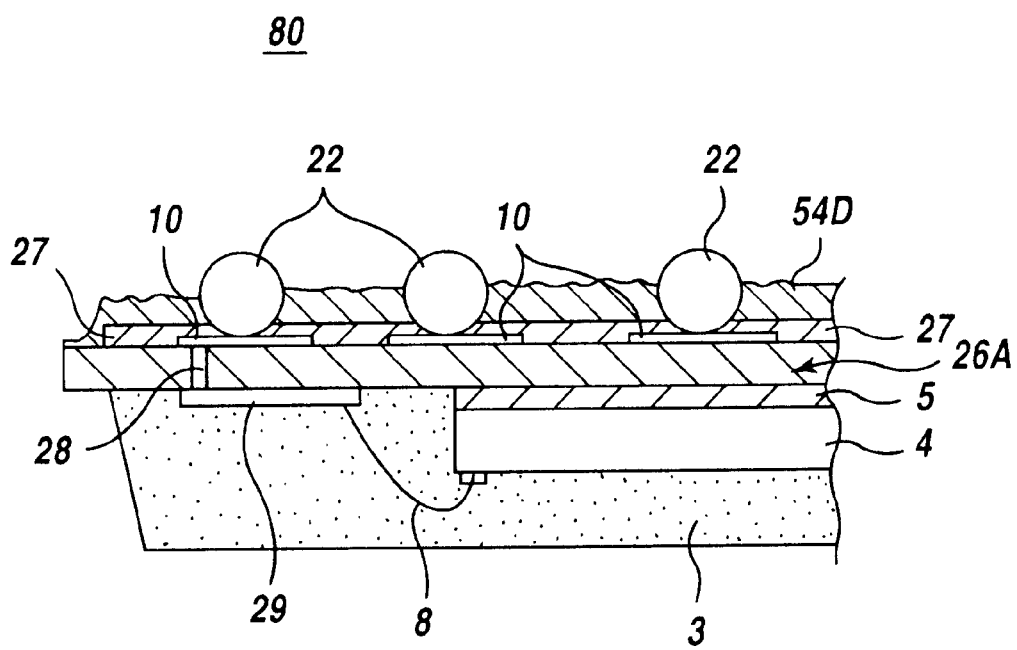
FIG. 21 is a diagram illustrating a semiconductor device completely manufactured after the heat processing step is completed in the method according to the first embodiment of the present invention.

As has been described above, the resin mask 44 is made of resin having a softening point at which the resin is softened in the heat processing step. Thus, the resin mask 44 is softened and flows when the solder balls 20 and the pad portions 10 are joined to each other in the heat processing step. As a result, the positioning openings 46 are filled with the resin of the resin mask 44 and the resin is adhered closely to the projection electrodes 22 as shown in FIG. 21.

The resin mask 44 which are restored after being softened functions as the so-called under-fill resin (hereinafter, the resin mask 44 restored after being softened is referred to as a under-fill resin 54D). Thus, even if the stress based on the difference between the thermal expansion of the semiconductor device and that of the circuit board is applied to projection electrodes, the stress is absorbed by the under-fill resin 54D. The projection electrodes 22 are prevent from being broken and separated from the pad portions 10.

In addition, since the resin mask 44 is restored after being softened in the heat processing step, the size of each of the positioning openings 46 before the resin mask 44 can be formed as large as possible with respect to the solder balls 20. Thus, in the projection electrode providing step, the solder balls 20 can be easily set on the solder pad 10 exposed through the positioning openings 46 of the resin mask 44.

Figure 6:
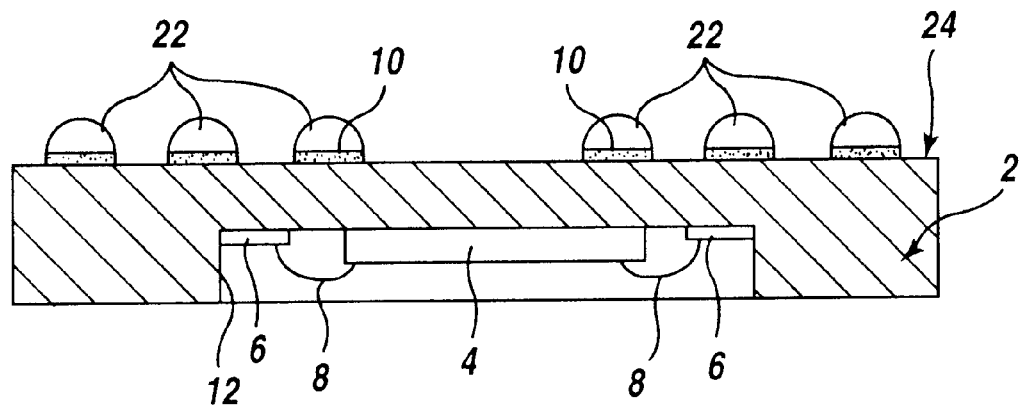
FIG. 6 is a diagram illustrating a semiconductor device having projection electrodes formed in accordance with the conventional method.

In the second and third embodiments, after the projection electrodes 22 are formed as shown In FIG. 6, the resin providing step and the resin plate providing step are carried out. However, immediately after the metal mask 14 is removed from the package 2, the resin providing step or the resin plate providing step may be carried out. In this case, since the solder balls 20 can be supported on the package 2 by the resin layer (the liquid resin 55 or the resin plate 62) in the heat processing step, the reliability of the semiconductor device can be further improved. In addition, in the heat processing step, the process for melting the solder balls 20 and the process for forming the under-fill resin layer 54B or 54C can be carried out together. Thus, the production process can be simplified.

The present invention is not limited to the aforementioned embodiments, and other variations and modifications may be made without departing from the scope of the claimed invention.

What is claimed is:

1. A method of forming projection electrodes, comprising the steps of:
   (a) mounting a resin mask on a base having pad portions on which projection electrodes are formed, said resin mask having openings used to position the projection electrodes;
   (b) providing paste on said pad portions of said base via said resin mask;
   (c) mounting the projection electrodes, positioned by said resin mask, on said pad portions of said base; and
   (d) carrying out a heat processing step for heating the pad portions and the projection electrodes positioned by said resin mask so that the projection electrodes are joined to the pad portions, wherein a melting point of said resin mask is not less than that of said projection electrodes.

2. The method as claimed in claim 1, wherein the resin mask is formed of thermoplastic resin.

3. The method as claimed in claim 1, wherein said projection electrodes are made of solder.

4. The method as claimed in claim 3, wherein a melting point (Tm) of the resin mask is higher than a melting point (Tb) of the solder.

5. A method of forming projection electrodes, comprising the steps of:
   (a) mounting a metal mask on a base having pad portions on which projection electrodes are formed, said metal mask having openings used to position the projection electrodes;
   (b) providing paste on said pad portions of said base via said metal mask;
   (c) mounting the projection electrodes, positioned by said metal mask, on said pad portions of said base;
   (d) carrying out, after said metal mask is removed from said base, a heat processing step for heating the pad portions and the projection electrodes so that the projection electrodes are joined to said pad portions; and
   (e) forming a resin layer on a surface of said base on which said projection electrodes are formed, a thickness of said resin layer being less than a height of each of said projection electrodes, wherein a melting point of said resin mask is not less than that of said projection electrodes.

6. The method as claimed in claim 5, wherein said step (e) includes a step of:
   providing resin having a liquidity on the surface of said base, wherein said resin layer is formed based on the resin having the liquidity.

7. The method as claimed in claim 5, wherein said step (e) includes a step of:
   setting a resin plate, having openings, on the surface of said base so that said projection electrodes are set in said openings of said resin plate, wherein said resin layer is formed based on said resin plate.

8. The method as claimed in claim 5, wherein said resin layer is made of thermoplastic resin.

9. The method as claimed in claim 5, wherein said projection electrodes are made of solder.

10. The method as claimed in claim 9, wherein a melting point (Tm) of the resin mask is higher than a melting point (Tb) of the solder.

11. A method of forming projection electrodes, comprising the steps of:
   (a) mounting projection electrodes on pad portions formed on a base on which a resin mask having openings is provided so that said pad portions are exposed through the openings of said resin masks; and
   (b) carrying out a heat processing step for heating said base, said resin mask and said projection electrodes so that said projection electrodes are joined to pad portions, wherein a melting point of said resin mask is not less than that of said projection electrodes.

12. The method as claimed in claim 11 further comprising the step of:
   (e) setting said resin mask on said base before said projection electrodes are mounted on said pad portions.

13. The method as claimed in claim 11, wherein said projection electrodes provided with paste are mounted on said pad portions in step (a).

14. The method as claimed in claim 11 further comprising:
   (f) providing paste on said projection electrodes before said projection electrodes are mounted on said pad portions.

15. The method as claimed in claim 11, wherein said resin mask is made of resin having a softening point at which said resin is softened In said heat processing step.

* * * * *